(12) United States Patent
Tabuchi et al.

(10) Patent No.: US 7,154,179 B2
(45) Date of Patent: Dec. 26, 2006

(54) SEMICONDUCTOR DEVICE

(75) Inventors: Kiyotaka Tabuchi, Kanagawa (JP); Hideshi Miyajima, Kanagawa (JP); Hideaki Masuda, Kanagawa (JP)

(73) Assignees: Sony Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/129,794

(22) Filed: May 16, 2005

(65) Prior Publication Data
US 2006/0017164 A1    Jan. 26, 2006

(30) Foreign Application Priority Data
May 18, 2004   (JP) .......................... P2004-147196

(51) Int. Cl.
*H01L 23/48*     (2006.01)
(52) U.S. Cl. ...................... 257/751; 257/760; 438/627; 438/653
(58) Field of Classification Search .............. 257/571, 257/486
See application file for complete search history.

(56) References Cited

U.S. PATENT DOCUMENTS

| | | | |
|---|---|---|---|
| 6,107,188 A | 8/2000 | Liu et al. | |
| 6,424,021 B1 | 7/2002 | Liu et al. | |
| 6,455,417 B1 | 9/2002 | Bao et al. | |
| 6,873,057 B1 * | 3/2005 | Chen et al. | 257/777 |
| 2004/0149686 A1 * | 8/2004 | Zhang et al. | 216/37 |
| 2004/0183162 A1 * | 9/2004 | Ohto et al. | 257/635 |
| 2004/0201103 A1 * | 10/2004 | Yau et al. | 257/758 |
| 2004/0207061 A1 * | 10/2004 | Farrar et al. | 257/678 |

FOREIGN PATENT DOCUMENTS

| | | |
|---|---|---|
| JP | 2000-183059 | 6/2000 |
| JP | 2004-128050 | 4/2004 |

* cited by examiner

*Primary Examiner*—Leonardo Andujar
*Assistant Examiner*—Krista Soderholm
(74) *Attorney, Agent, or Firm*—Sonnenschein Nath & Rosenthal LLP

(57) ABSTRACT

A semiconductor device, wherein an increase of a capacity between wiring layers is suppressed, reliability of wiring and property of withstand voltage of a diffusion prevention insulation film can be improved and the wiring resistance can be maintained low, is provided by comprising an interlayer insulation film formed on a substrate, a wiring formed on a trench pattern formed on the interlayer insulation film, and a diffusion prevention insulation film formed on an upper surfaces of the interlayer insulation film including the wiring and preventing diffusion of metal from the wiring; wherein the diffusion prevention insulation film has a middle layer between a lowermost layer and an uppermost layer, wherein the lowermost layer is formed so as to contact the upper surfaces of the interlayer insulation layer including the wiring, the uppermost layer constitutes an uppermost portion of the diffusion prevention insulation film, and the middle layer has a lower relative dielectric constant than those of the lowermost layer and the uppermost layer.

8 Claims, 4 Drawing Sheets

SEMICONDUCTOR DEVICE

CROSS REFERENCES TO RELATED APPLICATIONS

The present invention contains subject matter related to Japanese Patent Application JP 2004-147196 filed in the Japanese Patent Office on 18 May 2004, the entire contents of which being incorporated herein by reference.

BACKGROUND OF THE INVENTION

1. Field of the Invention

The present invention relates to a semiconductor device, and particularly relates to a semiconductor device having a multilayer wiring structure using Cu wiring.

2. Description of the Related Art

In recent years, a technique on a wiring process has become increasingly significant for high-speed operating semiconductor integrated circuit devices (LSIs) as the LSIs become highly integrated. This is because disadvantages of a signal transmission delay have become noticeable as semiconductor elements become finer. To suppress an increase of the signal transmission delay, lower resistance of wiring, and a reduction of a capacity between wirings and a capacity between wiring layers are necessary.

As to attaining low resistance of the wiring, a semiconductor device using a copper (Cu) wiring having lower resistance comparing with that of a conventionally used aluminum alloy wiring has been practically used. Also, as to a reduction of a capacity between wirings and a capacity between wiring layers, an insulation film having a low relative dielectric constant (a low dielectric constant film) comparing with that of a silicon oxide used conventionally as an interlayer insulation film has been studied, and introduction of a multilayer wiring technique using a Cu wiring and a low dielectric film has been studied.

Here, since Cu is a material having a very high diffusion coefficient, to prevent diffusion of Cu from a Cu wiring to an interlayer insulation film on the Cu wiring, it is necessary to provide a diffusion prevention insulation film on the interlayer insulation film provided with the Cu wiring in a state of covering the Cu wiring.

As the diffusion prevention insulation film, silicon nitride (SiN) having a Cu diffusion prevention function and a relative dielectric constant of 7 or so and silicon carbonitride (SiCN) having a relative dielectric of 5 or so are used. For example, an example of a semiconductor device, wherein a Si enriched lower layer silicon nitride based insulation film having high adhesiveness with a Cu wiring and an upper layer silicon nitride based material film having a stoichiometric composition are stacked as diffusion prevention insulation films on an interlayer insulation film provided with the Cu wiring, has been reported (for example, refer to the Japanese Unexamined Patent Publication No. 2000-183059).

However, in a semiconductor device as above, a relative dielectric constant of a diffusion prevention insulation film is high, so that it is necessary to lower the dielectric constant not only of the interlayer insulation film but of the diffusion prevention insulation film to reduce the capacity between wiring layers as the semiconductor device becomes finer. However, when the dielectric constant of the diffusion prevention insulation film is made lower, film density of the diffusion prevention insulation film becomes low, so that a surface reaction with the Cu wiring becomes weak and adhesiveness of the diffusion prevention insulation film and the Cu wiring declines. Consequently, voids arise as a result that Cu easily moves and disadvantages of declining the wiring reliability arise, such that electro migration (EM) resistance and stress migration (SM) resistance decline.

Also, as a result that the film density of the diffusion prevention insulation film declines, there is a disadvantage that oxygen and water from the air or the interlayer insulation film provided as an upper layer of the diffusion prevention insulation film permeate the diffusion prevention insulation film, and the Cu wiring as the lower layer is oxidized to increase the wiring resistance. Furthermore, due to a decline of the film density, it is liable that strength of the diffusion prevention insulation film itself declined and resistance properties, such as time dependence on dielectric breakdown (TDDB), decline.

SUMMARY OF THE INVENTION

To overcome the above disadvantages, according to the present invention, there is provided a semiconductor device comprising an insulation film formed on a substrate, a conductive layer formed on a trench pattern formed on the insulation film, and a diffusion prevention insulation film formed on an upper surfaces of the insulation film including the conductive layer and preventing diffusion of metal from the conductive layer; wherein the diffusion prevention insulation film has a middle layer between a lowermost layer and an uppermost layer, wherein the lowermost layer is formed so as to contact the upper surfaces of the insulation layer including the conductive layer, the uppermost layer constitutes an uppermost portion of the diffusion prevention insulation film, and the middle layer has a lower relative dielectric constant than those of the lowermost layer and the uppermost layer.

According to a semiconductor device as above, since the diffusion prevention insulation film is configured by sandwiching between a lowermost layer and an uppermost layer a middle layer having a lower relative dielectric constant than those of the lowermost layer and the uppermost layer, a low dielectric constant can be attained in the diffusion prevention insulation film, so that a capacity thereof can be reduced even in the case where the diffusion prevention insulation film is made thinner as the semiconductor device becomes finer. Also, the lowermost layer and the uppermost layer of the diffusion prevention insulation film have a higher relative dielectric constant than that of the middle layer, so that the film density becomes higher than that of the middle layer. As a result, the lowermost layer formed in a state of contacting an insulation film including a conductive layer obtains high film density, so that adhesiveness of the diffusion prevention insulation film and the conductive layer is enhanced. Also, the uppermost layer composing the uppermost portion of the diffusion prevention insulation film becomes hard to be permeated by water and oxygen from the air and the interlayer insulation film as the upper layer due to the high film density, so that oxidization of the conductive layer is prevented. Furthermore, as a result that the film density of the lowermost layer and the uppermost layer is made high, strength of the diffusion prevention insulation film itself can be also maintained.

As explained above, according to the semiconductor device of the present invention, even in the case where the diffusion prevention insulation film is made thin, a capacity of a diffusion prevention insulation film is reduced, so that a capacity between wiring layers can be reduced. Also, as a result that adhesiveness between the diffusion prevention insulation film and a conductive layer becomes high, arising of voids caused because metal elements in the conductive layer become easy to move is prevented, so that the EM resistance and the SM resistance of the conductive layer can be improved and wiring reliability can be improved. Furthermore, since oxidization of the conductive layer is prevented, wiring resistance can be maintained low. Also, because strength of the diffusion prevention insulation film itself is maintained, property of withstand voltage, such as TDDB, can be also improved.

As a result, a capacity between wiring layers can be reduced, wiring reliability and property of withstand voltage of the diffusion prevention insulation film are improved, and wiring resistance can be maintained low, so that a high-speed CMOS device having high density can be realized. Accordingly, performance of computers, game machines and mobile products can be remarkably improved.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, embodiments of the present invention will be explained based on the drawings.

Figure 1:
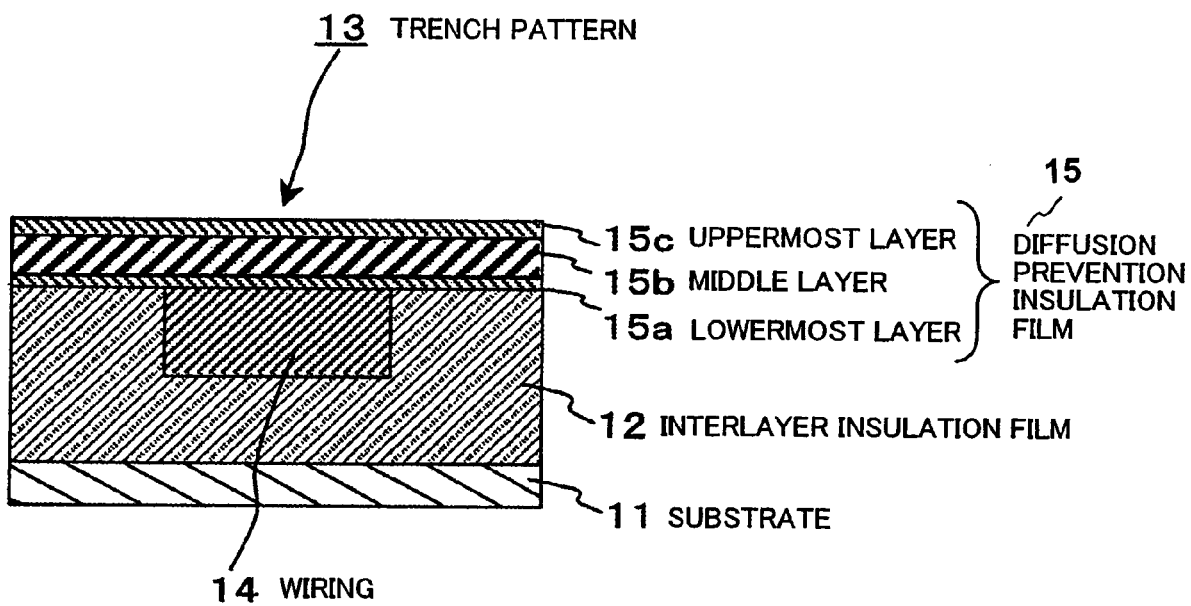
FIG. 1 is a sectional view for explaining a semiconductor device according to an embodiment of the present invention.

An example of a semiconductor device according to an embodiment of the present invention will be explained with reference to the sectional view in FIG. 1. As shown in FIG. 1, an interlayer insulation film 12 is formed on a substrate 11 formed with a semiconductor element, etc.

The interlayer insulation film 12 is formed with a trench pattern 13, and a barrier layer (not shown) is provided in a state of covering the inner wall of the trench pattern 13. Also, a conductive layer (wiring 14), for example, made by Cu is provided inside the trench pattern 13 via the barrier layer. Here, the barrier layer is to prevent diffusion of Cu from the wiring 14 to the interlayer insulation film 12.

A diffusion prevention insulation film 15 is provided on the interlayer insulation film 12 including the wiring 14. The diffusion prevention insulation film 15 is to prevent diffusion of Cu from the wiring 14 to an interlayer insulation film (not shown) to be provided thereon. The diffusion prevention insulation film 15 is formed to be a film thickness of 35 nm or thinner due to the design in the case of the 65 nm process rule, and the film thickness is assumed to be, for example, 35 nm here.

Here, the diffusion prevention insulation film 15 in the semiconductor device of the present embodiment is configured to be in a state where a middle layer 15b is sandwiched between the lowermost layer 15a provided on the interlayer insulation film 12 including the wiring 14 and the uppermost layer 15c for composing the uppermost portion of the diffusion prevention insulation film 15. The middle layer 15b has a lower relative dielectric constant than those of the lowermost layer 15a and the uppermost layer 15c. Therefore, even in the case where the diffusion prevention insulation film 15 is made thinner due to the semiconductor device becoming finer, the dielectric constant of the diffusion prevention insulation film 15 can be made low. Also, since the lowermost layer 15a and the uppermost layer 15b have a higher dielectric constant than that of the middle layer 15b, they are formed to have higher film density than comparing with the middle layer 15b.

Specifically, the uppermost layer 15c and the lowermost layer 15a are configured to have a relative dielectric constant of, for example, 4.0 or higher but lower than 6.0, and the middle layer 15b is configured to have a relative dielectric constant of, for example, lower than 4.0.

Here, an example of a multilayer structure of the diffusion prevention insulation film 15 will be explained. In the diffusion prevention insulation film 15, the uppermost layer 15a formed on the interlayer insulation film 12 including the wiring 14 is, for example, made by a SiCN film and configured to have a relative dielectric constant of 4.7 or higher and 5.2 or lower. As will be explained later on, the relative dielectric constant is higher than that of the middle layer 15b formed on the lowermost layer 15a, and the lowermost layer 15a is formed to have higher film density comparing with the middle layer 15b. Accordingly, a surface reaction of the diffusion prevention insulation film 15 and the wiring 14 is intensified and the adhesiveness can be improved.

It is preferable that a film thickness of the lowermost layer 15a is 1 nm or thicker and 10 nm or thinner, and more preferably 1 nm or thicker and 5 nm or thinner. When 1 nm or thicker, the lowermost layer 15a can surely improve adhesiveness between the diffusion prevention insulation film 15 and the wiring 14. Also, when made to be 10 nm or thinner, more preferably 5 nm or thinner, because a film thickness of the diffusion prevention insulation film 15 is, for example, 35 nm, a film thickness of the middle layer 15b having a lower dielectric constant than that of the lowermost layer 15a can be made thicker by an amount that the film thickness of the lowermost layer becomes thinner, so that the dielectric constant of the diffusion prevention insulation film 15 can be made lower.

Note that, the lowermost layer 15a is made by a SiCN film here, but the present invention is not limited to this, and it may be configured, for example, by a SiC film to have a relative dielectric constant of 4.5 or higher and 5.0 or lower. Note that the lowermost layer 15a is preferably formed by a film containing nitrogen (N) because prevention of diffusion of Cu from the wiring 14 can be secured.

Also, the middle layer 15b formed on the lowermost layer 15a is made, for example, by a SiC film and configured to have a relative dielectric constant of 3.2 or higher but lower than 4.0. The thicker the film thickness of the middle layer 15b is, the more preferable for attaining a low dielectric constant of the diffusion prevention insulation film 15. The thickness is determined by subtracting film thicknesses of the lowermost layer 15a and the later explained uppermost layer 15c from a thickness of the entire diffusion prevention insulation film 15.

Furthermore, the uppermost layer 15c formed on the middle layer 15b and composing the uppermost portion of the diffusion prevention insulation film 15 is made, for example, by a SiCN film and configured to have a relative dielectric constant of 4.7 or higher and 5.2 or lower. As a result, the uppermost layer 15c is formed to have higher film density comparing with that of the above explained middle layer 15b, so that permeation of water and oxygen from the air or the interlayer insulation film (not shown) as the upper layer can be prevented.

A film thickness of the uppermost layer 15c is preferably 5 nm or thicker and 15 nm or thinner. When 5 nm or thicker, permeation of water and oxygen from the air or the interlayer insulation film as the upper layer can be surely prevented by the uppermost layer 15c, and oxidization of the wiring 14 as a lower layer of the diffusion prevention insulation film 15 is prevented. Also, when made to be 15 nm or thinner, since a film thickness of the diffusion prevention insulation film 15 is, for example, 35 nm, a film thickness of the middle layer 15b having a lower relative dielectric constant comparing with that of the uppermost layer 15c can be made thicker by an amount that the film thickness of the uppermost layer 15c becomes thinner, so that the dielectric constant of the diffusion prevention insulation film 15 can be made low.

Note that the uppermost layer 15c is made by a SiCN film here, but the present invention is not limited to this and the uppermost layer 15c may be configured, for example, by a SiC film to have a relative dielectric constant of 4.5 or higher and 5.0 or lower.

Figure 2A:
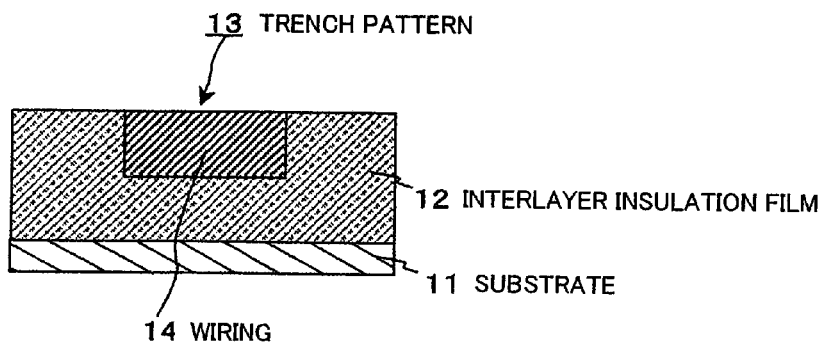
FIG. 2A to FIG. 2D are sectional views of production steps for explaining a semiconductor device according to the embodiment of the present invention.

A semiconductor device configured as above is produced by a trench wiring method, such as a Damascene method. Here, a production method of the semiconductor device will be explained by using the sectional views of the production steps in FIG. 2A to FIG. 2D. First, as shown in FIG. 2A, an interlayer insulation film 12 is formed on a substrate 11. Then, by a normal photolithography technique and a reactive etching technique using a resist pattern as a mask, a trench pattern 13 to be a wiring trench is formed on the interlayer insulation film 12. After that, a barrier layer (not shown) is formed on the interlayer insulation film 12 in a state of covering the inner wall of the trench pattern 13, and a conductive film is formed on the barrier layer in a state of burying the trench pattern 13. After that, by removing the conductive film by the CMP (chemical mechanical polishing) method until a surface of the interlayer insulation film 12 is exposed, a wiring 14 made by Cu is formed inside the pattern 13 via the barrier layer.

Next, by performing plasma processing by a reducing gas, such as ammonium ($NH_3$) or hydrogen ($H_2$), surface processing on the wiring 14 is performed. As a result thereof, an oxide of Cu generated on the surface of the wiring 14 is removed and adhesiveness with the lowermost layer of the diffusion prevention insulation film to be formed in a subsequent step is improved. Alternately, for performing the plasma processing stably, a low reactive inert gas, such as nitrogen ($N_2$), helium (He), argon (Ar) or xenon (Xe), may be also used with the above reducing gas.

Figure 2B:
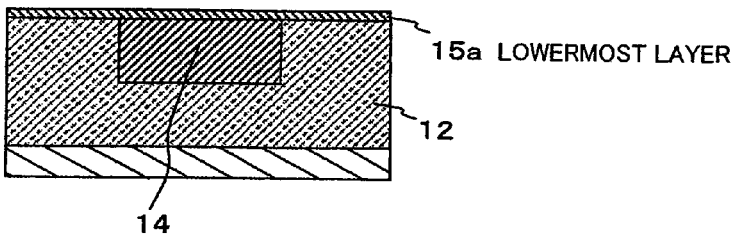

Next, as shown in FIG. 2B, a diffusion prevention insulation film 15 (refer to FIG. 1 explained above) is formed on the interlayer insulation film 12 including the wiring 14. In this case, a lowermost layer 15a, for example, made by a SiCN film is formed first on the interlayer insulation film 12 including the wiring 14. It is assumed that this film is formed, for example, by the chemical vapor deposition (CVD) method by using a plasma CVD apparatus. An example of the film forming condition is that trimethyl silane (a flow amount: 200 $cm^3$/min.), ammonia ($NH_3$) (a flow amount: 400 $cm^3$/min.) and helium (He) (a flow amount: 300 $cm^3$/min.) are used for the film forming gas, a pressure of a film forming atmosphere is set to 400 Pa, and an RF (radio frequency) power of the CVD apparatus is set to 300 W. Note that the gas flow amounts indicate volume flow amounts in the standard state. Here, relative dielectric constants of the respective layers composing the diffusion prevention insulation film 15 are determined not only by materials of the layers but by adjusting the film forming condition. When forming a film under the above condition, a SiCN film having a relative dielectric constant of 4.7 or higher and 5.2 or lower is obtained.

Note that when forming a SiC film as the lowermost layer 15a, an example of the film forming condition is that trimethyl silane (a flow amount: 300 $cm^3$/min.) and He (a flow amount: 800 $cm^3$/min.) are used as the film forming gas, a pressure of the film forming atmosphere is set to be 1200 Pa, and the RF power is set to 450 W. As a result, a SiC film having a relative dielectric constant of 4.5 or higher and 5.0 or lower is obtained.

Figure 2C:
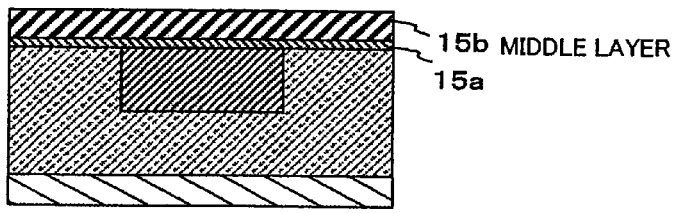

Next, as shown in FIG. 2C, a middle layer 15b, for example, made by SiC is formed on the lowermost layer 15a. It is assumed that the film forming is performed, for example, by the CVD method by using a plasma CVD apparatus. An example of the film forming condition is that trimethyl silane (a flow amount: 300 $cm^3$/min.) and helium (He) (a flow amount: 1000 $cm^3$/min.) are used for the film forming gas, a pressure of a film forming atmosphere is set to 800 Pa, and an RF power is set to 200 W. As a result, a SiC film having a relative dielectric constant of 3.2 or higher but lower than 4.0 is obtained.

Figure 2D:
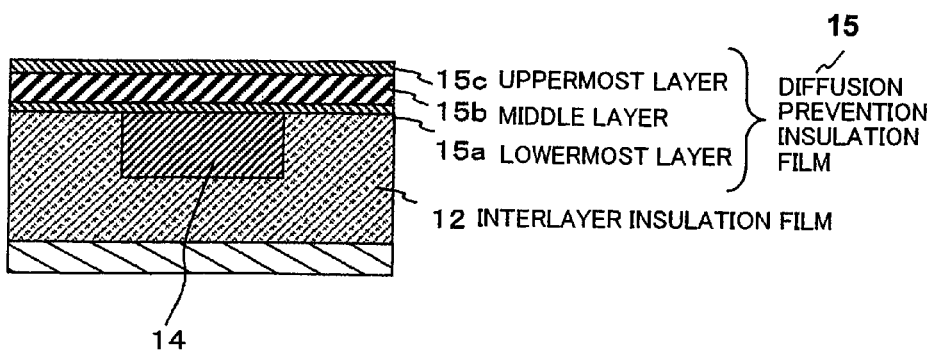

Successively, as shown in FIG. 2D, an uppermost layer 15c, for example, made by SiCN is formed on the middle layer 15b. It is assumed that this film is formed, for example, by the CVD method by using a plasma CVD apparatus. A film forming condition is that trimethyl silane (a flow amount: 200 $cm^3$/min.), ammonia ($NH_3$) (a flow amount: 400 $cm^3$/min.) and helium (He) (a flow amount: 300 $cm^3$/min.) are used for the film forming gas, a pressure of a film forming atmosphere is set to 400 Pa, and an RF power of the CVD apparatus is set to 300 W. As a result, a SiCN film having a relative dielectric constant of 4.7 or higher and 5.2 or lower is obtained.

Note that when forming a SiC film as the uppermost layer 15c, an example of the film forming condition is that trimethyl silane (a flow amount: 300 $cm^3$/min.) and He (a flow amount: 800 $cm^3$/min.) are used as the film forming gas, a pressure of the film forming atmosphere is set to be 1200 Pa, and the RF power is set to 450 W. As a result, a SiC film having a relative dielectric constant of 4.5 or higher and 5.0 or lower is obtained.

Steps after that are, for example, to from an interlayer insulation film on the diffusion prevention insulation film 15, then, a wiring trench is formed on the interlayer insulation film, and a contact hole reaching to the wiring 14 is formed at the bottom portion of the wiring trench. After that, by burying the wiring trench and the contact hole with a conductive film, a wiring and a via hole are formed respectively for the wiring trench and the contact hole. Then, by forming a diffusion prevention insulation film again on the wiring and repeating the above steps, a multilayer wiring structure is formed.

Note that examples of forming respective layers having different relative dielectric constants composing the diffusion prevention insulation film 15 by using a film forming gas containing trimethylsilane and adjusting the gas flow amount, a pressure of the film forming atmosphere and RF power, etc. are explained here, however, the film forming condition is not limited to the above examples and respective layers having different relative dielectric constants can be formed by using a film forming gas containing a compound having a composition formula of $Si_mC_nH_l$ and changing the composition ratio.

As explained above, according to the semiconductor device configured as above, the diffusion prevention insulation film 15 is configured to be in a state where a middle layer 15b having a lower relative dielectric constant than those of the lowermost layer 15a and the uppermost layer 15c is sandwiched between the lowermost layer 15a formed on the interlayer insulation film 12 including the wiring 14 and the uppermost layer 15c composing the uppermost portion of the diffusion prevention insulation film 15. Accordingly, even when the diffusion prevention insulation film 15 is made thinner due to the semiconductor device getting finer, the dielectric constant of the diffusion prevention insulation film 15 can be made low, so that a capacity between wiring layers can be reduced.

Also, because the lowermost layer 15a formed on the interlayer insulation film 12 including the wiring 14 obtains high film density, the adhesiveness of the diffusion prevention insulation film 15 and the wiring 14 is enhanced, so that arising of voids caused as a result that Cu in the wring 14 becomes easy to move can be prevented and the EM resistance and the SM resistance of the wiring 14 can be improved, which result in an improvement of wiring reliability. Furthermore, in the uppermost layer 15c composing the uppermost portion of the diffusion prevention insulation film 15, because the film density becomes high, water and oxygen from the air or the interlayer insulation film as an upper layer thereof are hard to permeate, so that oxidization of the wiring 14 is prevented and wiring resistance can be maintained low. Also, due to the high film density of the lowermost layer 15a and the uppermost layer 15c, strength of the diffusion prevention insulation film 15 itself is also maintained, so that the property of withstand voltage, such as TDDB, can be also improved.

As a result, a capacity between wiring layers can be reduced, wiring reliability and property of withstand voltage of the diffusion prevention insulation film 15 can be improved, and the wiring resistance can be maintained low, so that a high-speed CMOS device with high density can be realized. Accordingly, performance of computers, game machines and mobile products can be remarkably improved.

Note that an example where the diffusion prevention insulation film 15 is formed to have a three-layer structure of the lowermost layer 15a, the uppermost layer 15c and the middle layer 15b sandwiched by the two layers is explained here, but the diffusion prevention insulation film 15 may be formed to have a multilayer structure of more than three layers. For example, at least either of between the lowermost layer 15a and the middle layer 15b and between the middle layer 15b and the uppermost layer 15c, an adhesive layer for enhancing adhesiveness of the middle layer 15b with the lowermost layer 15a or the uppermost layer 15c may be provided. In this case, when the adhesive layer is configured to have an intermediate relative dielectric constant of, for example, those of the middle layer 15b and the lowermost layer 15a, it can obtain intermediate film density of those of the middle layer 15b and the lowermost layer 15a. Due to this, even when a film density difference is large between the middle layer 15b and the lowermost layer 15a, the difference is reduced and the adhesiveness can be improved. The adhesive layer can be provided between the middle layer 15b and the uppermost layer 15c in the same way.

Also, in the present embodiment, an example of using Cu as the wiring 14 was explained, but the present invention can be applied to the cases of using aluminum (Al), tungsten (W), silver (Ag), gold (Au) or alloys of these metals, such as a Cu alloy, as the wiring 14 other than Cu.

EXAMPLES

Example 1

In the present example, an effect of preventing water permeation of the uppermost layer 15c in the diffusion prevention insulation film 15 of the semiconductor device explained in the embodiment shown in FIG. 1 was tested.

First, after forming a highly hygroscopic tetraethoxy silane (TEOS) film on a silicon (Si) substrate, a SiC film with low film density having a relative dielectric constant of 3.5 was formed on the TEOS film. The SiC film corresponds to the middle layer 15b in the diffusion prevention insulation film 15 of the present embodiment. After that, a SiCN film with high film density having a relative dielectric constant of 4.9 was formed to be a thickness of 5 nm on the SiC film. The SiCN film corresponds to the uppermost layer 15c in the diffusion prevention insulation film 15 of the present embodiment. The result was called a sample 1. On the other hand, what obtained by forming a TEOS film on a Si substrate, then, forming a SiC film having a relative dielectric constant of 3.5 corresponding to the middle layer 15b on the TEOS film was called a sample 2. Furthermore, what obtained by forming a SiC film having a relative dielectric constant of 3.5 corresponding to the middle layer 15b on a Si substrate was called a sample 3.

Figure 3:
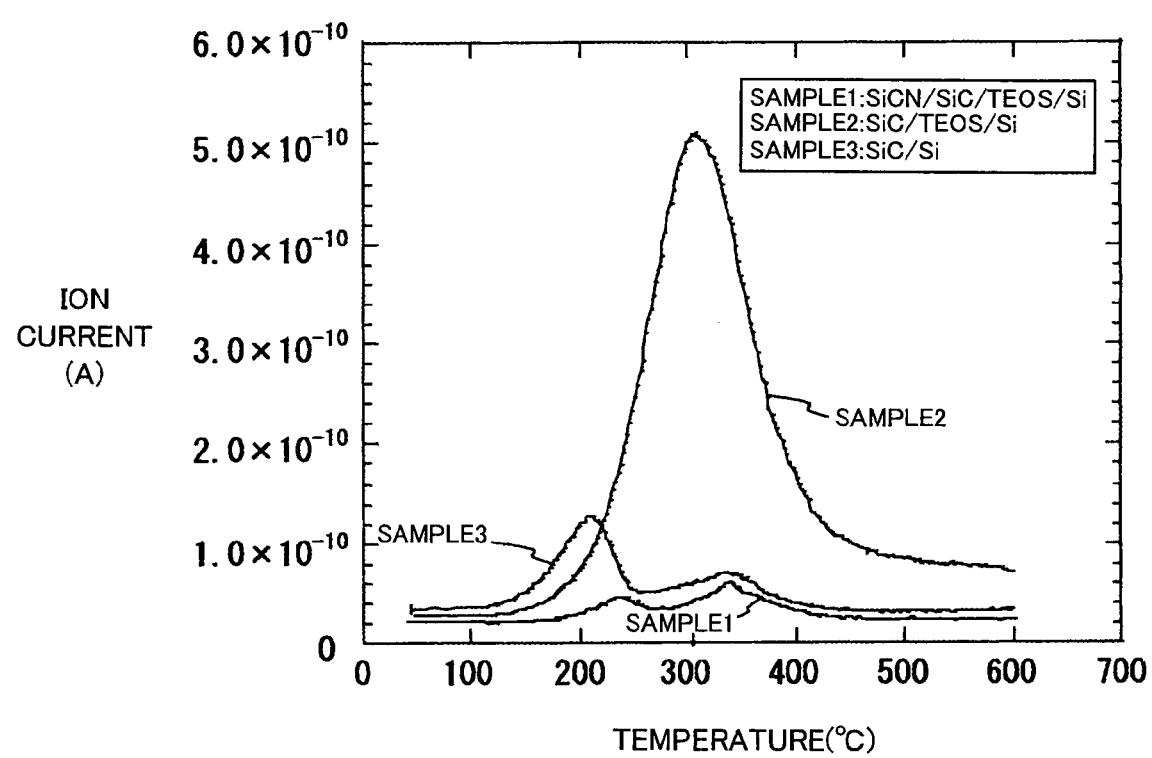
FIG. 3 is a graph of a water release amount in a semiconductor device according to the example of the present invention.

A result of measuring a water release amount when heating the samples 1 to 3 is shown in the graph in FIG. 3. In this graph, the abscissa axis indicates temperature and the ordinate axis indicates an ion current value as an index of the water release amount, and a result of measuring a water release amount when heating the respective samples is shown. As shown in the graph, as to the sample 1, despite provision of the highly hygroscopic TEOS film as a lower layer, almost no peak indicating release of water was observed even when heated.

On the other hand, as to the sample 2, a notable peak was observed indicating release of water at about 300° C., and the SiC film with low film density having a relative dielectric constant of 3.5 corresponding to the middle layer 15b of the present embodiment was confirmed to have no effect of preventing water permeation. As to the sample 3, a small peak was observed indicating release of water at about 200° C.

From the above result, it was confirmed that the SiCN film formed to be a thickness of 5 nm having a relative dielectric constant of 4.9 corresponding to the uppermost layer 15c of the diffusion prevention insulation film 15 prevented water permeation from the TEOS film and the SiC film provided as its lower layer.

Example 2

In the present example, the EM resistance of the diffusion prevention insulation film 15 in the semiconductor device explained in the embodiment was tested.

First, as shown in FIG. 1, a diffusion prevention insulation film 15 having the same configuration as that in the embodiment was formed in the same wiring structure as that in the embodiment. Specifically, the lowermost layer 15a and the uppermost layer 15c in the diffusion prevention insulation film 15 were SiCN films having a thickness of 5 nm, a relative dielectric constant of 4.9 and high film density, and the middle layer 15b was a SiC film with low film density having a relative dielectric constant of 3.5. The result is called a sample "A". Also, what using a SiC film having a relative dielectric constant of 3.5 corresponding to the middle layer 15b of the present embodiment as a diffusion prevention insulation film 15 is called a sample "B", and what using a SiC film having a relative dielectric constant of 3.8 corresponding to the middle layer 15b of the present embodiment is called a sample "C". Furthermore, what using a SiCN film having a relative dielectric constant of 4.9 as a diffusion prevention insulation film 15 is called a sample "D". Here, the configuration of the sample "D" is the same as that of the related art explained in the "Background of the Invention".

Figure 4:
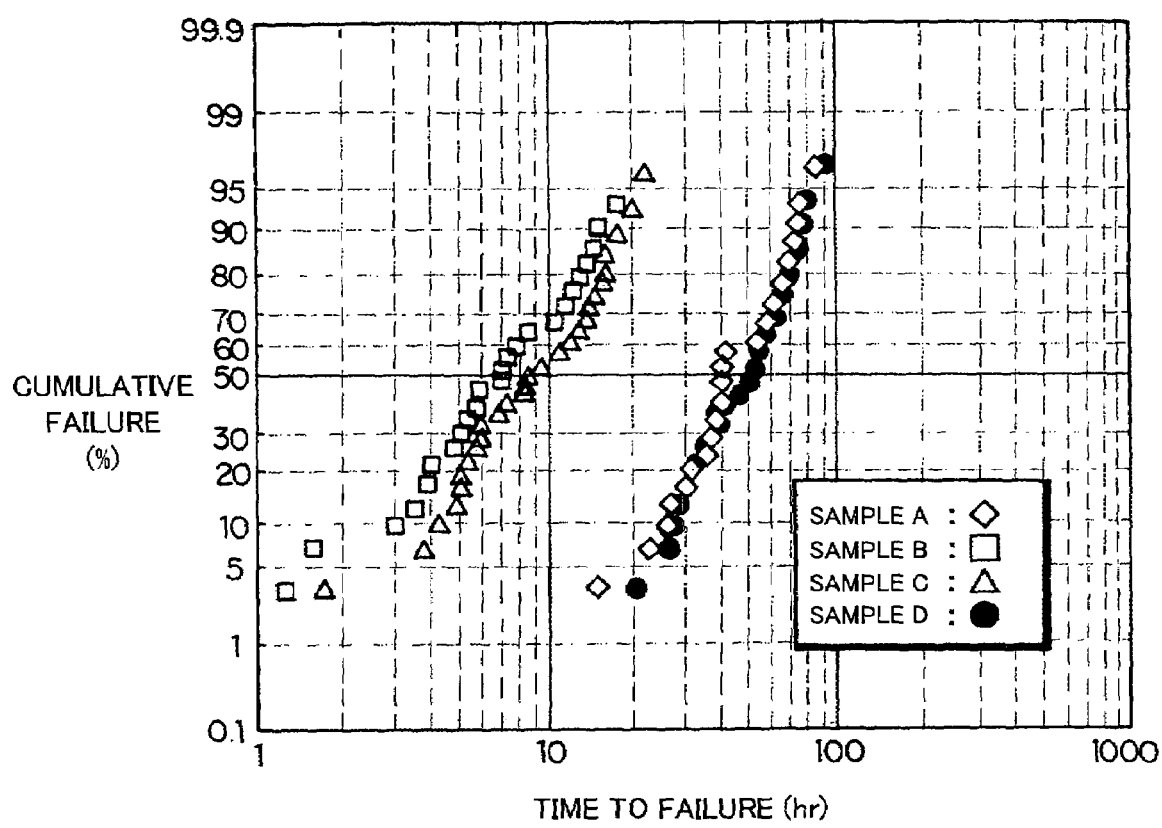
FIG. 4 is a graph of the EM resistance in a semiconductor device according to the example of the present invention.

A result of measuring the EM resistance on the samples "A" to "D" is shown in the graph in FIG. 4. In this graph, the abscissa axis indicates time and the ordinate axis indicates a cumulative failure percentage of the wiring 14, wherein the longer the time becomes, the higher the EM resistance is exhibited. As shown in the graph, the sample "A" having a diffusion prevention insulation film 15 having the same configuration as that of the present embodiment had a SiC film having low film density as the middle layer 15b, but since the lowermost layer 15a was configured to have high film density, it was confirmed that adhesiveness with the wiring 14 was improved and equivalent EM resistance to that of the sample "D" having a diffusion prevention insulation film 15 having the same configuration as that of the related art was exhibited.

Also, the samples "B" and "C" having a diffusion prevention insulation film 15 made by a SiC film with low film density having a relative dielectric constant of 3.5 or 3.8 corresponding to the middle layer 15b of the present embodiment were confirmed to have declined adhesiveness between the diffusion prevention insulation film 15 and the wiring 14 and deteriorated EM resistance.

The embodiments explained above are for easier understanding of the present invention and not to limit the present invention. Accordingly, respective elements disclosed in the above embodiments includes all modifications in designs and equivalents belonging to the technical field of the present invention.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor device comprising:
   an insulation film formed on a substrate,
   a conductive layer formed on a trench pattern formed on said insulation film, and
   a diffusion prevention insulation film formed on upper surfaces of said insulation film and said conductive layer and preventing diffusion of metal from said conductive layer; wherein
   said diffusion prevention insulation film has a middle layer between a lowermost layer and an uppermost layer and has a film thickness of 35 nm or thinner, wherein said lowermost layer is formed so as to contact said upper surfaces of said insulation layer including said conductive layer, said uppermost layer constitutes an uppermost portion of said diffusion prevention insulation film, and said middle layer has a lower relative dielectric constant than those of said lowermost layer and said uppermost layer.

2. A semiconductor device as set forth in claim 1, wherein relative dielectric constants of said lowermost layer and said uppermost layer are 4.0 or higher but lower than 6.0 and a relative dielectric constant of said middle layer is lower than 4.0.

3. A semiconductor device as set forth in claim 1, wherein said lowermost layer comprises a material containing nitrogen.

4. A semiconductor device as set forth in claim 1, wherein an adhesive layer is formed between at least one of:
   said lowermost layer and said middle layer, and
   said middle layer and said uppermost layer,
   the adhesive layer enhancing adhesiveness between said middle layer and at least one of said lowermost layer and said uppermost layer.

5. A semiconductor device comprising:
   an insulation film formed on a substrate,
   a conductive layer formed on a trench pattern formed on said insulation film, and
   a diffusion prevention insulation film formed on upper surfaces of said insulation film and said conductive layer and preventing diffusion of metal from said conductive layer; wherein
   said diffusion prevention insulation film has a middle layer between a lowermost layer and an uppermost layer, wherein said lowermost layer is formed so as to contact said upper surfaces of said insulation layer including said conductive layer, said uppermost layer constitutes an uppermost portion of said diffusion prevention insulation film, and said middle layer is SiC and has a lower relative dielectric constant than those of said lowermost layer and said uppermost layer.

6. A semiconductor device as set forth in claim 5, wherein relative dielectric constants of said lowermost layer and said uppermost layer are 4.0 or higher but lower than 6.0 and a relative dielectric constant of said middle layer is lower than 4.0.

7. A semiconductor device as set forth in claim 5, wherein said lowermost layer comprises a material containing nitrogen.

8. A semiconductor device as set forth in claim 5, wherein an adhesive layer is formed between at least one of:
   said lowermost layer and said middle layer, and
   said middle layer and said uppermost layer,
   the adhesive layer enhancing adhesiveness between said middle layer and at least one of said lowermost layer and said uppermost layer.

* * * * *